United States Patent [19]

Proksa

[11] Patent Number: 4,949,040
[45] Date of Patent: Aug. 14, 1990

[54] MAGNETIC RESONANCE SPECTROMETER

[75] Inventor: Roland Proksa, Hamburg, Fed. Rep. of Germany

[73] Assignee: U.S. Philips Corporation, New York, N.Y.

[21] Appl. No.: 325,630

[22] Filed: Mar. 20, 1989

[30] Foreign Application Priority Data

Mar. 31, 1988 [DE] Fed. Rep. of Germany ....... 3811066

[51] Int. Cl.$^5$ ............................................. G01R 33/20
[52] U.S. Cl. ..................................... 324/307; 324/312; 324/322
[58] Field of Search ............... 324/300, 307, 309, 310, 324/311, 312, 313, 314, 318, 322, 301

[56] References Cited

U.S. PATENT DOCUMENTS

| Re. 32,712 | 7/1988 | Likes | 324/307 |
|---|---|---|---|
| 4,567,439 | 1/1986 | McGregor | 324/301 |
| 4,614,907 | 9/1986 | Nagayama | 324/312 |
| 4,673,880 | 6/1987 | Compton | 324/309 |
| 4,733,184 | 3/1988 | McKinnon | 324/309 |
| 4,743,851 | 5/1988 | Lim et al. | 324/312 |
| 4,814,709 | 3/1989 | Takeda et al. | 324/309 |

Primary Examiner—Michael J. Tokar
Attorney, Agent, or Firm—Thomas A. Briody; Jack E. Haken; Jack D. Slobod

[57] ABSTRACT

A magnetic resonance spectrometer in which an analog-to-digital converter in the receiving branch converts the spin resonance signals, or a spin resonance signal transposed to a lower frequency range, into a digital signal, and in which a Fourier transformation circuit is located in a signal path subsequent to the analog-to-digital converter. The signal path between the analog-to-digital converter and the Fourier transformation circuit includes at least one combination of a digital filter and a sampling frequency reducing circuit. The output signal of the reducing circuit has sampling frequency which has been reduced by an integer factor with respect to its input signal and, the reduced sampling frequency is a non-integer factor lower than the frequency of the signal on the output of the digital filter.

8 Claims, 2 Drawing Sheets

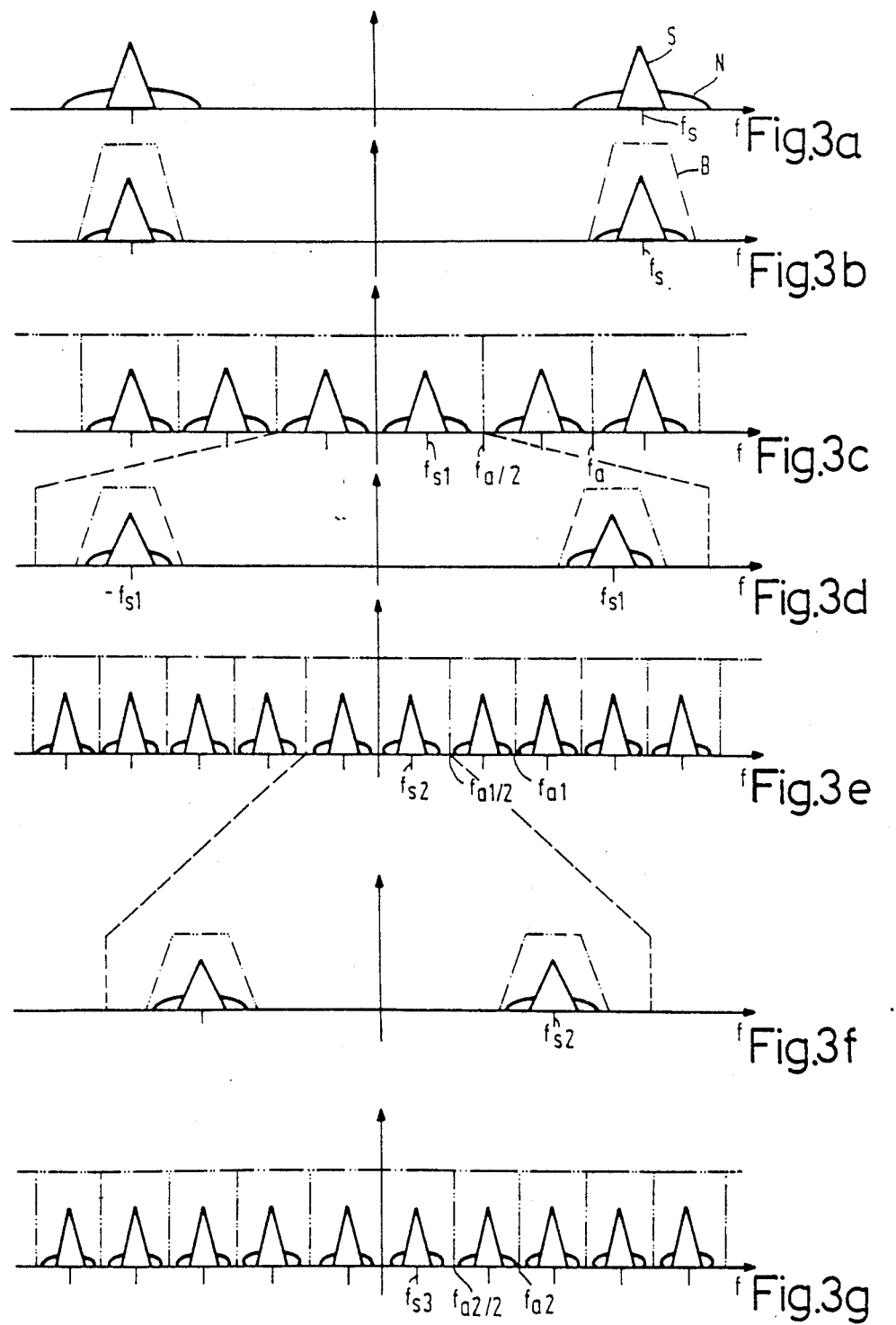

4,949,040

MAGNETIC RESONANCE SPECTROMETER

BACKGROUND OF THE INVENTION

1. Field of the Invention

The invention relates to a magnetic resonance spectrometer in which an analog-to-digital converter in the receiving branch converts the spin resonance signals, or a spin resonance signal transposed to a lower frequency range, into a digital signal, and in which a Fourier transformation circuit is arranged in a signal path subsequent to the analog-to-digital converter.

2. Description of the Prior Art

A magnetic resonance spectrometer of this kind is described in DE-OS 36 04 281 corresponding to commonly owned U.S. Pat. No. 4,733,184. Therein the spin resonance signal is first converted to the baseband after which it is converted into a series of digital data words by means of an analog-to-digital converter. The conversion to the baseband necessitates quadrature demodulation, the spin resonance signal then being mixed with an oscillation having the Larmor frequency which is applied to the two mixing stages with a 90° phase shift.

The construction of the two mixing stages of the known spectrometer must be exactly symmetrical and the phase shift between the two oscillations must be exactly 90°. In an analog mixing stage, it is rather complex to satisfy this requirement. A further drawback consists in that the lowest useful frequency in the baseband is so low that a dc amplifier is required for amplifying the output signal of the mixing stages. A shift of the operating point of this amplifier causes a disturbing drift which gives rise to reconstruction errors during the further processing of the signal. Moreover, the low-frequency noise (also referred to as flicker noise) in the baseband and the harmonics of the mains frequency have a particularly disturbing effect.

SUMMARY OF THE INVENTION

It is an object of the invention to construct a spectrometer of the kind set forth so that the complex analog components can be dispensed with and that the reconstruction is not affected by drift effects.

This object is achieved in accordance with the invention in that in the signal path between the analog-to-digital converter and the Fourier transformation circuit there is arranged at least one circuit which comprises a digital filter and a sampling frequency reducing circuit, the output signals of which have a sampling frequency which has been reduced by an integer factor with respect to their input signals, the reduced sampling frequency being a non-integer factor lower than the frequency of the signal on the output of the digital filter.

Signal processing in accordance with the invention is essentially digital. Thus drift effects are irrelevant. At present, however, there is not yet available a Fourier transformation circuit enabling an analog signal in the frequency range (a few MHz) occurring during magnetic resonance examinations to be subjected to a Fourier transformation in real-time. For the time being this is economically feasible only for frequencies of up to a few 100 KHz.

Therefore, in accordance with the invention (at least) one sampling frequency reducing circuit is provided between the analog-to-digital converter and the Fourier transformation circuit which reduces the sampling frequency to such an extent that it can be processed by the Fourier transformation circuit. This means that the sampling frequency with which the spin resonance signal is ultimately applied to the Fourier transformation circuit is substantially lower than the frequency of the signal itself. This is contrary to the customary sampling methods where the sampling frequency is chosen so as to be at least twice the signal frequency in order to prevent spectral folding effects (aliasing) which falsify the signals. The invention utilizes the fact that the centre frequency of the spin resonance signals is known and that these spin resonance signals have a narrow bandwidth with respect to said center frequency. Therefore, with respect to the signal frequency the sampling frequency can always be chosen so that by the undersampling the useful signal can be transposed to a frequency range outside the baseband and within a periodic raster defined by half the sampling frequency. The preceding digital filter prevents interference signals from getting into this range from another range through aliasing.

When the reduced sampling frequency is a non-integer factor lower than the frequency of the signal on the output of the digital filter, it can always be ensured, as has already been stated, that the useful signal band is not folded into the baseband, i.e. into a frequency range around the frequency zero. Consequently, contrary to the known spectrometer comprising a quadrature demodulator, such a spectrometer requires only one instead of two signals paths in which the spin resonance signal is processed prior to the Fourier transformation.

The factor whereby the sampling frequency is reduced cannot be arbitrarily large, because that would lead to digital filter requirements which can hardly be satisfied. One possibility of achieving a sufficiently large reduction of the sampling frequency consists in the connection of two successive circuits comprising the digital filter and the sampling frequency reducing circuit in the signal path. Another possibility consists in that the quotient of the frequency of the analog input signal and the sampling frequency is larger than 0.5 and not integer.

The sampling frequency of the analog-to-digital converter is then already chosen to be so low that undersampling and related aliasing effects occur whereby the analog input signal is digitally transposed to a lower frequency range. Because the quotient of the signal frequency and the sampling frequency is not integer, the signal is prevented from reaching the baseband.

The invention will be described in detail hereinafter with reference to the drawing. Therein:

BRIEF DESCRIPTION OF THE DRAWING

FIGS. 3a to 3g show the spectra at the points a to g of the arrangement shown in FIG. 2.

DETAILED DESCRIPTION OF THE PREFERRED EMBODIMENTS

Figure 1:
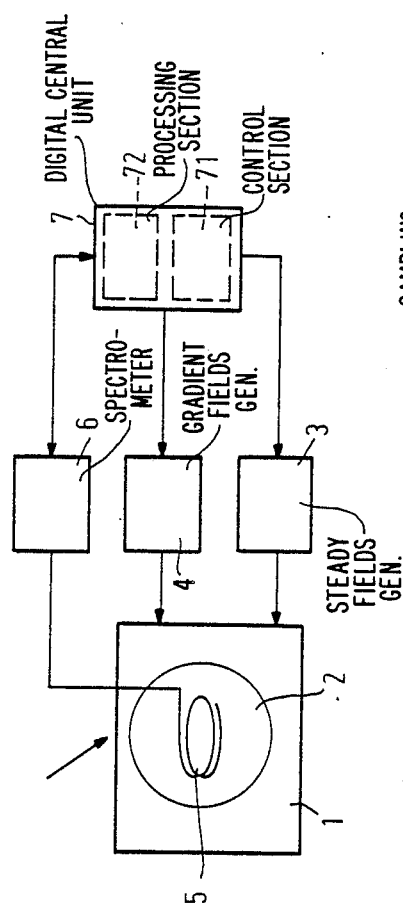
FIG. 1 diagrammatically shows a magnetic resonance tomography apparatus in which the invention can be used.

The reference numeral 1 in FIG. 1 denotes an apparatus which generates a uniform and steady magnetic field of, for example 0.21T in an examination zone 2, which field extends perpendicularly to the plane of drawing; the apparatus can also generate, if desired, magnetic gradient fields, i.e. magnetic fields which extend in the same direction as the uniform, steady magnetic field but whose intensity varies linearly in the direction of the magnetic field or in a direction perpendicular thereto. To this end, the apparatus 1 is coupled to a generator 3 which generates the steady magnetic field, and to a generator 4 which supplies the currents for the various magnetic gradient fields. There is also provided an RF coil 5 which generates an RF magnetic field which extends perpendicularly to the steady magnetic field in the transmission mode and which receives the spin resonance signals arising in the examination zone in the receiving mode; this RF coil is connected to the output of a spectrometer 6. In the transmission mode the spectrometer supplies the RF energy for the RF coil 5 and it processes the spin resonance signals induced in this coil in the receiving mode.

The generators 3 and 4 and the spectrometer 6 are controlled by a digital central unit 7 which comprises a control section 71 for this purpose. The digital central unit also comprises a processing section 72 which processes the data supplied by the spectrometer 6 and reconstructs the nuclear magnetization distribution in the examination zone 2 therefrom. This processing comprises inter alia a Fourier transformation which is performed real-time.

Figure 2:
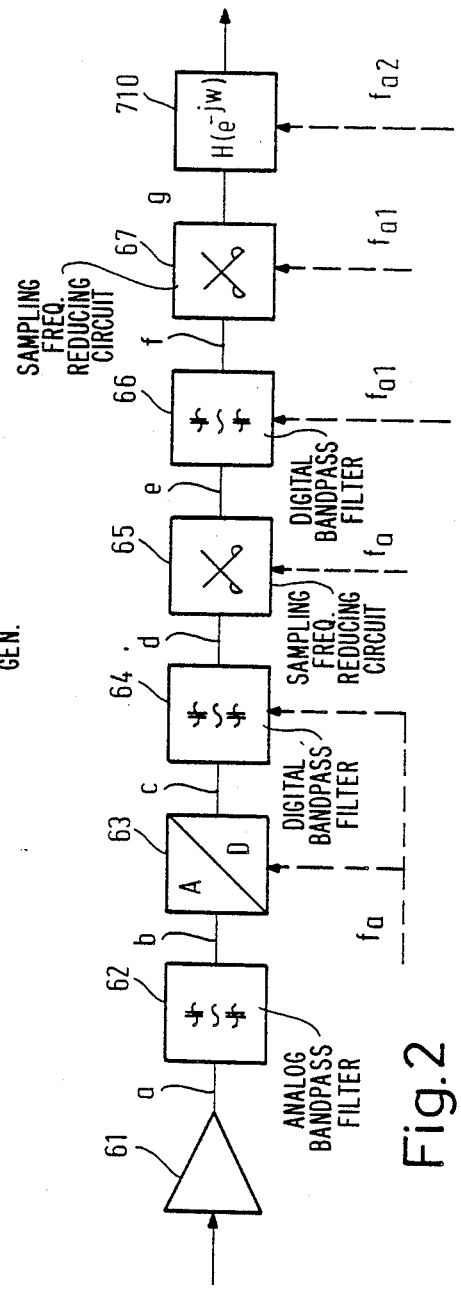
FIG. 2 shows the block diagram of the receiving section of a spectrometer in accordance with the invention.

As appears from the block diagram of the receiving section of the spectrometer shown in FIG. 2, the signal received by the RF coil 5 from the examination zone is applied to a preamplifier 61. When the induction of the uniform, steady magnetic field amounts to 0.12 T, the mean value of the frequency of the spin resonance signal amounts to approximately 9 MHz. The bandwidth depends on the magnitude of the gradient of the magnetic gradient field activated during the detection of the spin resonance signal and on the size of the examination zone. Generally, however, the bandwidth does not exceed 60 kHz. The spectrum on the output a of the preamplifier 61 is shown in FIG. 3a; therein the diagrammatically represented spectrum of the spin resonance signal is denoted by the letter s and the substantially wider noise spectrum is denoted by the letter N.

The output signal of the preamplifier is applied to an analog-to-digital converter 63, via an analog bandpass 62 having a centre frequency of 9 MHz. The spectrum of the signal on the output b of the analog bandpass filter 62, shown in FIG. 3b essentially corresponds to the spectrum shown in FIG. 3a, only the noise band having been cut by the bandpass filter whose transfer function is diagrammatically represented by the broken line f in FIG. 3b.

The analog-to-digital converter 63 converts the analog input signal into a series of digital data words having a wordlength of 12 bits; in order to satisfy the customary signal dynamics requirements, however, a word length of 10 bits could also suffice. The gain of the preamplifier 61 should be chosen so that the noise component of the spin resonance signal is greater than a quantization step of the converter 63. The frequency $f_a$ at which the analog spin resonance signal is sampled amounts to 7.2 MHz. As a result of this sampling, the signal frequency $f_s$ is converted from a value of 9 MHz to a value $f_{s1}$ of 1.8 MHz which is situated in a frequency range from $-f_a/2$ to $+f_a/2$ (3.6 MHz) which is repetitive with a period $f_a$. In order to prevent interference voltages from outside the useful frequency range from being converted to the frequency $f_{sn}$ and the vicinity thereof, the bandpass filter 62 must be designed so that all frequency components situated more than 1.8 MHz from the frequency $f_s$ are suppressed as well as possible.

FIG. 3c shows the spectrum on the output of the analog-to-digital converter 63. The frequency $f_{s1} = 1.8$ MHz results from the absolute value of the difference $f_s - f_a$. There are further components which are each time symmetrically situated with respect to the sampling frequency $f_a$ and the harmonics thereof and which occupy the same position with respect to the sampling frequency by the signal having the frequency $f_{s1}$ with respect to the frequency zero.

The output signal of the analog-to-digital converter 63 is applied to a digital filter 64 having a bandpass characteristic which operates at the same sampling frequency as the analog-to-digital converter 63. The centre frequency of this bandpass filter lies at the frequency $f_{s1}$ (1.8 MHz) and the transfer function of this filter is chosen so that the noise on the other side of the useful frequency band is suppressed in order to prevent the folding of these noise components, due to the subsequent processing of the signal, into the signal frequency range. The spectrum on the output d of this filter is shown in FIG. 3d (be it at a different frequency scale with respect to the FIGS. 3a to 3c). The output signal of the digital filter is applied to a first sampling frequency reducing circuit 65. This circuit serves to admit only every $p^{th}$ data word to the further processing, p being an integer factor which amounts to 5 in the present case. Consequently, the data stream on the output e is reduced to one fifth ($=1/p$) with respect to the data stream on the input of this circuit, i.e. 1.44 million data words per second appear on the output of the circuit 65.

A sampling and reducing circuit of this kind can be realized in various ways. It may comprise, for example a gate circuit and a counter which counts pulses at the sampling frequency $f_a$ and which is reset after every fifth pulse, thus opening the gate circuit so that the data word present at that instant can pass. It is also possible to apply the clock frequency to the gate via a frequency divider.

FIG. 3e shows the spectrum on the output of the circuit 65. As a result of the reduction of the sampling frequency to one fifth of the value $f_a$, there is obtained the new sampling frequency $f_{a1} = 1.44$ MHz, so that the spectrum is repeated with the periodicity of $f_{a1}$. After the folding, the signal frequency is also reduced by the factor 5, so that the signal frequency $f_{f2}$ on the output of the circuit amounts to 360 kHz ($f_{s1}/p$).

The reduction of the sampling frequency corresponds to a further undersampling (this time in the digital range) so that frequencies which were previously situated far from the useful frequency can be folded into the useful frequency range. For example, a frequency component on the output c of the analog-to-digital converter 63 which is situated at a distance of 1.08 MHz from the carrier $f_{s1}$ is folded exactly to the frequency $f_{s2} = 360$ kHz by the undersampling by means of the circuit 65. If noise signals were still present in this frequency range prior to undersampling, the signal-to-noise ratio would be affected. In order to avoid this, the bandpass filter 64 must suppress all signals to the extent possible for a bandwidth of 720 kHz (i.e. each time at the distance of 360 kHz from $f_{s1}$). However, it would not be disadvantageous if the suppression were to take place only for frequencies situated slightly further away. In that case components would already be folded from the band from 0 to $f_a$ (FIG. 3c) the band from 0 to $f_{a1}$, but the folded components would be situated at the edges of the range from 0 to $f_{a1}$ where only noise is present, but not the useful signal.

It will be apparent from the foregoing that it is particularly advantageous when the frequencies $f_{s1}$ and $f_{s2}$ are always situated exactly in the centre of the range from 0 to $f_a$ or from 0 to $f_{a1}$. If the signal frequencies were shifted to one side, the requirements imposed on the filters 62 and 64 would be more severe.

It can be demonstrated that the frequency $f_{s1}$ always occupies the attractive central position when the relation $$f_a = \frac{4}{4n+1} f_s \qquad (1)$$

is satisfied. Therein, n must be a positive integer. The signal frequency behind the analog-to-digital converter then has the value $$f_{s1} = f_s - f_n f_a.$$

In the present example, n=1.

A similarly attractive position of the frequency $f_{s1}$ is obtained when the following relation is satisfied:

$$f_a = \frac{4}{4n-1} f_s \qquad (2)$$

However, when the sampling frequency is proportioned in accordance with the equation (2), the useful frequency band is situated in a reversed position after sampling, i.e. the frequency components which were situated above $f_s$ prior to sampling are situated below $f_{s1}$ after sampling (and vice versa). Consequently, the nuclear magnetization distribution might be reconstructed the wrong way around. This can be prevented, however, by bringing this frequency band in the reversed position again by further, suitable undersampling, so that it occupies the original position again. The image reversal could also be cancelled, however, by way of software during the data processing subsequent to the Fourier transformation.

Slight deviations of the sampling frequency $f_a$ with respect to the values defined in the equations 1 and 2 are permissible, but should not be so large that the quotient $f_s/f_a$ becomes an integer; in that case the useful frequency band would be situated symmetrically with respectively to the frequency $f=0$ through undersampling, the negative frequencies then being folded into the positive frequency range. In order to enable reconstruction in such a case, the spin resonance signal should be processed in a phase-shifted manner in two parallel branches, like in a quadrature demodulator.

The same unfavourable condition could arise, for example it the sampling frequency were reduced by a factor p=4 in the circuit 64. It would then amount to 1.8 MHz, i.e. exactly equal to the (reduced) signal frequency $f_{s1}$, so that $f_{s2}$ would be zero.

The most attractive position is again obtained from the equations 1 and 2 where only $f_s$ must be replaced by $f_{s1}$ and $f_a$ must be replaced by $f_{a1}$. As can be readily demonstrated, the resultant sampling frequency $f_{a1}=1.44$ MHz for p=5 satisfies the equation (1) for n=1.

The output signal of the sampling frequency reducing circuit 64 is applied, via a further digital filter 66 having a bandpass characteristic, to a further sampling and reducing circuit 67. The sampling frequency of the filter 66 amounts to $f_{a1}$ (1.44 MHz). The centre frequency of the filter is 360 kHz and its bandwidth amounts to approximately 72 kHz. Thus, the frequency spectrum of FIG. 3f appears on the output of the filter; this frequency spectrum is again shown at an increased scale with respect to the FIGS. 3d and e.

The sampling frequency reducing circuit 67 again 67 again reduces the data stream to one fifth, i.e. only every fifth one of the 1.44 million data words occurring every second on the input of the circuit 67 is processed, i.e. 288,000 words per second. The sampling frequency on the output of the circuit 67 is thus reduced to a value $f_{a2}=288$ kHz. With respect to the signal frequency $f_{s2}$, this value again satisfies the condition determined by the equation (1) when $f_s$ is replaced by $f_{s2}$ and $f_{a1}$ is replaced by $f_{a2}$. As a result of the reduction of the sampling frequency, the signal frequency $f_{S2}$ is also reduced to a value $f_{s3}$ which is one fifth of $f_{s2}$, i.e. from 360 kHz to 72 kHz. FIG. 3g shows the resultant spectrum on the output of each circuit 67.

The output signal of the circuit 67 is applied to a Fourier transformation circuit 720 which forms part of the processing circuit 72. The clock frequency for the input signal is identical to the frequency $f_{a2}$, so that a few thousand data words are processed in the circuit 720 during the sampling interval which has a duration of from 2 to 30 ms and during which the spin resonance signal is converted into a series of data words, the circuit 720 calculating therefrom, by Fourier transformation, the absolute value and the phase of the spectral components for a number of discrete frequencies which is half as large. This circuit may comprise a system comprising a plurality of transputers which simultaneously process the sampling values. The frequency spectrum thus reconstructed covers (see FIG. 3g) the entire frequency range from 0 to $f_a$ (144 KHz). The useful signal band which is essential for the further processing, however, is substantially narrower and amounts to, for example only 20 kHz. Consequently, only the output signals of the circuit 710 which correspond to this frequency band are used for the further processing, i.e. the output signals which are associated with frequencies between 62 kHz and 82 kHz in the present example.

In the foregoing a magnetic resonance spectrometer has been described in which the spin resonance signals were applied directly to the analog-to-digital converter. However, when these signals have a frequency which is higher than the frequency that can be handled by the analog-to-digital converter, prior to digitizing, they must be transposed to a lower frequency range by means of a mixing stage.

What is claimed is:

1. A magnetic resonance spectrometer comprising: an analog-to-digital converter (63) in a signal path for receiving spin resonance signals; a digital filter (64, 66) in the signal path after the analog-to-digital converter; a sampling frequency reducing circuit (65, 67) in the signal path after the digital filter; and a Fourier transformation means (710) in the signal path after the sampling frequency reducing circuit; wherein said sampling frequency reducing circuit has at its output a sampling frequency ($f_{a1}$, $f_{a2}$) which is reduced by an integer factor from the sampling frequency ($f_a$, $f_{a1}$) at its input and which equals the frequency of the signal ($f_{s1}$, $f_{s2}$) at the input to the sampling frequency reducing circuit divided by a first non-integer factor greater than 1.

2. A spectrometer as claimed in claim 1, wherein the analog-to-digital converter (63) has a sampling frequency ($f_a$) which equals the frequency ($f_s$) at the input to the analog-to-digital converter multiplied by a second non-integer factor greater than 0.5.

3. A spectrometer as claimed in claim 1, wherein said first non-integer factor is equal to $(4n+a)/4$, where "n" is a positive integer and "a" is $+1$ or $-1$.

4. A spectrometer as claimed in claim 2, wherein said first non-integer factor is equal to $(4n+a)/4$, where "n" is a positive integer and "a" is $+1$ or $-1$.

5. A magnetic resonance spectrometer comprising: an analog-to-digital converter (63) in a signal path for receiving spin resonance signals; a first digital filter (64) in the signal path after the analog-to-digital converter; a first sampling frequency integer factor reducing circuit (65) in the signal path after the digital filter; a second digital filter (66) in the signal path after the first sampling reducing circuit; a second sampling frequency integer factor reducing circuit (67) in the signal path after the second digital filter; and a analog-to-digital converter (710) in the signal path after the second sampling frequency reducing circuit; wherein said first sampling frequency reducing circuit has at its output a reduced sampling frequency ($f_{a1}$) which equals the frequency of the signal ($f_{s1}$) at the input to the first sampling frequency reducing circuit divided by a first non-integer factor greater than 1 and said second sampling frequency reducing circuit has at its output a reduced sampling frequency ($f_{a2}$) which equals the frequency of the signal ($f_{s2}$) at the input to the second sampling frequency reducing circuit divided by a second non-integer factor greater than 1.

6. A spectrometer as claimed in claim 5, wherein the analog-to-digital converter (63) has a sampling frequency ($f_a$) which equals the frequency ($f_s$) at the input to the analog-to-digital converter multiplied by a third non-integer factor greater than 0.5.

7. A spectrometer as claimed in claim 5, wherein said first and second non-integer factors are equal to $(4n+a)/4$, where "n" is a positive integer and "a" is $+1$ or $-1$.

8. A spectrometer as claimed in claim 7, wherein said first and second non-integer factors are equal to $(4n+a)/4$, where "n" is a positive integer and "a" is a $+1$ or $-1$.

* * * * *